US012560633B2

(12) United States Patent
Horii

(10) Patent No.: US 12,560,633 B2
(45) Date of Patent: Feb. 24, 2026

(54) CURRENT DETECTION CIRCUIT, SWITCHING POWER SUPPLY DEVICE, AND INDUSTRIAL EQUIPMENT

(71) Applicant: Rohm Co., Ltd., Kyoto (JP)

(72) Inventor: Kazuhiro Horii, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 242 days.

(21) Appl. No.: 18/399,616

(22) Filed: Dec. 28, 2023

(65) Prior Publication Data

US 2024/0133930 A1 Apr. 25, 2024

Related U.S. Application Data

(63) Continuation of application No. PCT/JP2022/023920, filed on Jun. 15, 2022.

(30) Foreign Application Priority Data

Jul. 1, 2021 (JP) ................................. 2021-110282

(51) Int. Cl.
*G01R 19/32* (2006.01)
*H02M 3/335* (2006.01)
*H03K 3/011* (2006.01)
*H03K 3/017* (2006.01)
(52) U.S. Cl.
CPC ............ *G01R 19/32* (2013.01); *H02M 3/335* (2013.01); *H03K 3/011* (2013.01); *H03K 3/017* (2013.01)
(58) Field of Classification Search
CPC .... G01R 1/203; G01R 19/0092; G01R 19/32; H02M 1/0009; H02M 3/335; H02M 3/33515; H03K 3/011; H03K 3/017; H03K 7/08; H03K 3/00; H03K 4/00; H03K 5/00; H03K 6/00; H03K 7/00;

H03K 9/00; H03K 11/00; H03K 12/00; H03K 17/00; H03K 19/00; H03K 21/00; H03K 23/00; H03K 25/00; H03K 27/00; H03K 29/00; H03K 99/00; H03K 2217/00
See application file for complete search history.

(56) References Cited

U.S. PATENT DOCUMENTS

2008/0219649 A1* 9/2008 Hirata ..................... H02P 6/182
388/811

FOREIGN PATENT DOCUMENTS

WO WO 2019/026398 2/2019

OTHER PUBLICATIONS

International Search Report and Written Opinion in International Appln. No. PCT/JP2022/023920, mailed on Aug. 9, 2022, 13 pages (with machine translation).

* cited by examiner

*Primary Examiner* — Judy Nguyen
*Assistant Examiner* — Brent J Andrews
(74) *Attorney, Agent, or Firm* — Fish & Richardson P.C.

(57) ABSTRACT

A current detection circuit includes a current detection resistor of which a first end is connected to a ground potential, a PWM signal generation circuit configured to output a PWM signal, a smoothing circuit configured to generate a smooth voltage by smoothing the PWM signal, and an amplifier circuit configured to amplify a voltage generated at a second end of the current detection resistor. The amplifier circuit is a grounded-base circuit or a grounded-gate circuit. A control terminal of a first transistor included in the grounded-base circuit or the grounded-gate circuit is configured to receive a voltage that is based on the smooth voltage.

13 Claims, 10 Drawing Sheets

CURRENT DETECTION CIRCUIT, SWITCHING POWER SUPPLY DEVICE, AND INDUSTRIAL EQUIPMENT

CROSS-REFERENCE TO RELATED APPLICATIONS

This nonprovisional application is a continuation application of International Patent Application No. PCT/JP2022/023920 filed on Jun. 15, 2022, which claims priority Japanese Patent Application No. 2021-110282 filed in Japan on Jul. 1, 2021, the entire contents of which are hereby incorporated by reference.

BACKGROUND OF THE INVENTION

1. Technical Field

The invention disclosed herein relates to a current detection circuit, a switching power supply device, and industrial equipment.

2. Description of Related Art

In a current detection circuit, current-voltage conversion needs to be performed by a current-voltage conversion element. Typical current-voltage conversion elements include a current transformer and a resistor.

A current transformer is disadvantageous due to its large size and high cost. To reduce power loss in a resistor, it is necessary to reduce potential difference across the resistor. In a case where the potential difference across the resistor is reduced, an amplifier circuit is necessary in order to amplify the potential difference across the resistor.

DETAILED DESCRIPTION

In the present description, a MOS field-effect transistor denotes a field-effect transistor of which a gate has a structure composed of at least three layers which are: a layer of a conductor or a semiconductor with a low resistance value, such as polysilicon; a layer of an insulator; and a layer of a P-type, N-type, or intrinsic semiconductor. That is, the gate structure of a MOS field-effect transistor is not limited to a three-layer structure of metal, oxide, and semiconductor.

Herein, a reference voltage denotes a voltage that is constant under ideal conditions, and may actually be a voltage that can vary slightly due to temperature variation, for example.

First Embodiment

Figure 1:
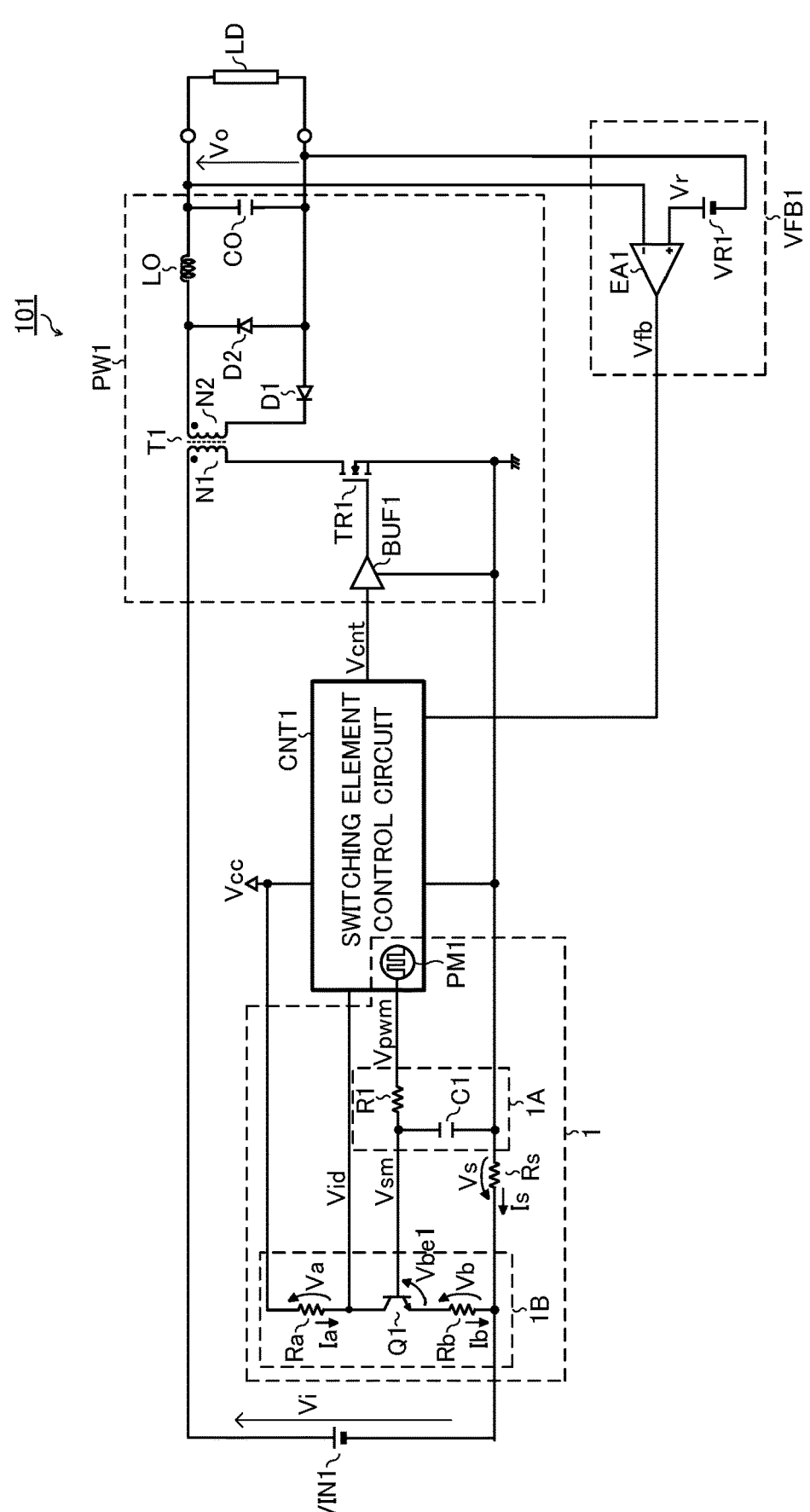
FIG. 1 is a diagram showing a schematic configuration of a switching power supply device according to a first embodiment.

FIG. 1 is a diagram showing a schematic configuration of a switching power supply device according to a first embodiment. A switching power supply device 101 according to the first embodiment (hereinafter referred to as "the switching power supply device 101") is one that converts an input voltage Vi generated by an input voltage supply VIN1 into an output voltage Vo and outputs the output voltage Vo. The switching power supply device 101 includes a power circuit PW1, an output voltage control signal generation circuit VFB1, a switching element control circuit CNT1, and a current detection circuit 1.

The power circuit PW1 includes a transformer T1, a switching element TR1, a buffer BUF1, a rectifier element D1, a freewheeling element D2, an output choke coil LO, and an output capacitor CO. The transformer T1 includes a primary winding N1 and a secondary winding N2. In the present embodiment, used as the switching element TR1 is an N-channel MOS field-effect transistor, but the switching element TR1 is not limited to an N-channel MOS field-effect transistor. The switching element TR1 may be a bipolar transistor, for example. Further, in the present embodiment, as the rectifier element D1 and the freewheeling element D2, diodes are used, but each of the rectifier element D1 and the freewheeling element D2 is not limited to a diode. The rectifier element D1 and the freewheeling element D2 may each be a synchronous rectifier element.

A first end of the primary winding N1 is connected to a positive pole of the input power supply VIN1. A second end of the primary winding N1 is connected to a drain of the switching element TR1. A source of the switching element TR1 is connected, via a current detection resistor Rs, to a negative pole of the input power supply VIN1.

A first end of the secondary winding N2 is connected to a cathode of the freewheeling element D2 and a first end of the output choke coil LO. A second end of the output choke coil LO is connected to a first end of the output capacitor CO and a first end of a load LD. A second end of the secondary winding N2 is connected to a cathode of the rectifier element D1. An anode of the rectifier element D1 is connected to an anode of the freewheeling element D2, a second end of the output capacitor CO, and a second end of the load LD. Across the output capacitor CO, an output voltage Vo is generated.

In the present embodiment, the power circuit PW1 is a single-ended forward converter. In the power circuit PW1, which is a single-ended forward converter, when the switching element TR1 is turned on, through the rectifier element D1 and through the output choke coil LO, a current is supplied to the load LD, and when the switching element TR1 is turned off, energy stored in the output choke coil LO is discharged, and through the freewheeling element D2, a current is supplied to the load LD.

Note that, the single-ended forward converter is merely an example, and the power circuit PW1 may be of any circuit type other than the single-ended forward type. Further, the power circuit PW1 may be configured not to include a transformer.

The output voltage control signal generation circuit VFB1 includes an error amplifier EA1 and a reference voltage supply circuit VR1. Note that the output voltage control signal generation circuit VFB1 may have any circuit configuration other than the one shown in FIG. 1, such as a circuit configuration including a photo coupler, for example.

To an inverting input end of the error amplifier EA1, the output voltage Vo is supplied. To a non-inverting input end of the error amplifier EA1, a positive pole of the reference voltage supply circuit VR1 is connected. A negative pole of the reference voltage supply circuit VR1 is connected to the second end of the output capacitor CO and the second end of the load LD.

An output signal of the error amplifier EA1 is supplied to the switching element control circuit CNT1.

The switching element control circuit CNT1 generates a switching control signal Vcnt according to the output signal of the error amplifier EA1, that is, according to an output signal of the output voltage control signal generation circuit VFB1. The switching control signal Vcnt is supplied, via the buffer BUF1, to a gate of the switching element TR1. In this manner, the switching element control circuit CNT1 controls on/off of the switching element TR1.

The current detection circuit 1 includes the current detection resistor Rs, a PWM signal generation circuit PM1, a smoothing circuit 1A, and an amplifier circuit 1B. Note that, although, in the present embodiment, the PWM signal generation circuit PM1 is disposed inside the switching element control circuit CNT1, the PWM signal generation circuit PM1 may instead be disposed outside the switching element control circuit CNT1.

The current detection resistor Rs is configured to be connected in series to the switching element TR1. A first end of the current detection resistor Rs is connected to a ground potential and the source of the switching element TR1. A second end of the current detection resistor Rs is connected to a second end of a resistor Rb, which will be described later.

The PWM signal generation circuit PM1 is configured to output a PWM signal Vpwm.

The smoothing circuit 1A is configured to generate a smooth voltage Vsm by smoothing the PWM signal Vpwm. The smoothing circuit 1A includes a resistor R1 and a capacitor C1. To a first end of the resistor R1, the PWM signal Vpwm is supplied, and a second end of the resistor R1 is connected to a base of an NPN transistor Q1, which will be described later, and to a first end of the capacitor C1. A second end of the capacitor C1 is connected to the ground potential.

The amplifier circuit 1B is configured to amplify a voltage generated at the second end of the current detection resistor Rs. The amplifier circuit 1B is a grounded-base circuit, and includes a resistor Ra, the NPN transistor Q1, and the resistor Rb. To a first end of the resistor Ra, a power supply voltage Vcc is supplied. A second end of the resistor Ra is connected to a collector of the NPN transistor Q1. A collector voltage of the NPN transistor Q1 becomes a current detection signal Vid, which is an output signal of the amplifier circuit 1B. To a base of the NPN transistor Q1, the smooth voltage Vsm is supplied. An emitter of the NPN transistor Q1 is connected to a first end of the resistor Rb. The second end of the resistor Rb is, as described previously, connected to the second end of the current detection resistor Rs.

The amplifier circuit 1B is a grounded-base circuit, and thus is unlikely to be affected by factors such as a Miller capacitance, and capable of performing a high-speed operation. Note that, as the amplifier circuit 1B, a grounded-gate circuit may be used instead of a grounded-base circuit. In a case where the amplifier circuit 1B is a grounded-gate circuit, as well, the amplifier circuit 1B is capable of performing a high-speed operation. By using a grounded-base circuit or a grounded-gate circuit as the amplifier circuit 1B, it is possible to achieve a high-speed operation of the amplifier circuit 1B at low cost.

The current detection signal Vid is supplied to the switching element control circuit CNT1. The switching element control circuit CNT1 uses the current detection signal Vid to perform, for example, an overcurrent protection operation, constant current control, etc.

Figure 2:
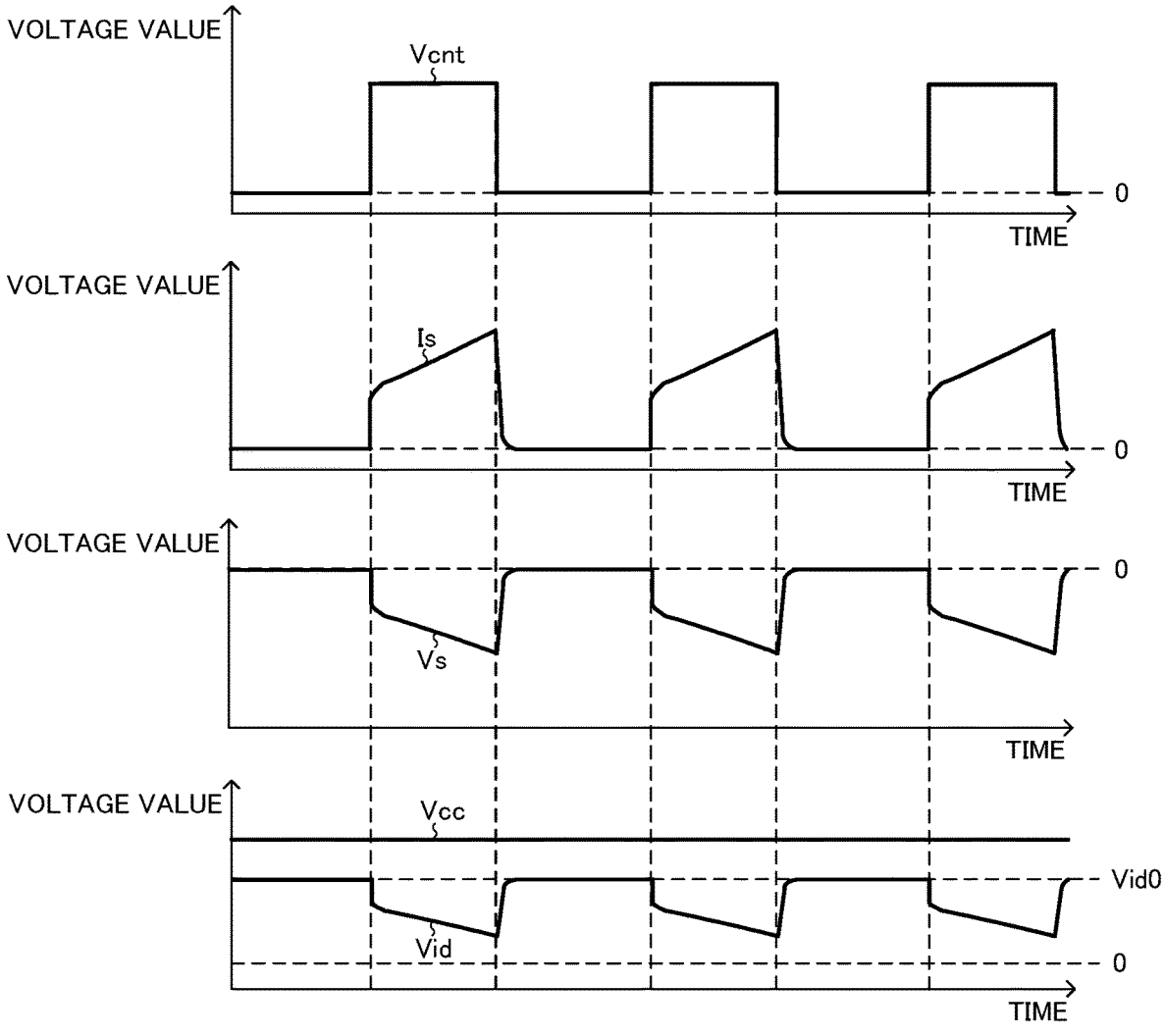
FIG. 2 is a diagram showing waveforms of voltages and currents of various units in the switching power supply device shown in FIG. 1.

Next, operation of the current detection circuit 1 will be described with reference to FIG. 2. FIG. 2 is a diagram showing waveforms of voltages and currents of various units in the switching power supply device 101 shown in FIG. 1. FIG. 2 shows the waveforms of the switching control signal Vcnt, a current Is flowing in the current detection resistor Rs, a voltage Vs generated at the second end of the current detection resistor Rs, the power supply voltage Vcc, and the current detection signal Vid. In FIG. 2, the horizontal axis represents time and the vertical axis represents voltage value or current value.

The current Is flowing in the current detection resistor Rs generates the voltage Vs at the second end of the current detection resistor Rs. The current detection resistor Rs is connected in series to the switching element TR1, so that the current Is flowing in the current detection resistor Rs is equal to a current flowing in the switching element TR1.

In a case where the NPN transistor Q1 has a sufficiently high hfe, formula (1) below holds, where $Vid0$ represents a value of the current detection signal Vid when the current Is is zero, that is, when the voltage Vs zero; a represents a resistance value of the resistor Ra; b represents a resistance value of the resistor Rb. From formula (1) below, it can be understood that, in the amplifier circuit 1B, an amplitude of the voltage Vs is amplified by (a/b) to be an amplitude of the current detection signal Vid.

$$Vid = Vid0 - (a/b) \cdot Vs \qquad (1)$$

If a base-emitter voltage $Vbe1$ of the NPN transistor Q1 varies due to individual variation, temperature variation, etc., $Vid0$ varies. By suppressing the variation of $Vid0$ due to variation of the base-emitter voltage $Vbe1$ of the NPN transistor Q1, it is possible to improve the detection accuracy of the current detection circuit 1. In the current detection circuit 1, variation of $Vid0$ is suppressed by adjusting duty of the PWM signal Vpwm. By using the PWM signal Vpwm, it is possible, without using a high-resolution and expensive DA converter, to improve the detection accuracy of the current detection circuit 1.

In order to suppress variation of Vid0 due to the individual variation of the base-emitter voltage Vbe1 of the NPN transistor Q1, the PWM signal generation circuit PM1 adjusts an initial value of the duty of the PWM signal Vpwm when no current is flowing in the current detection resistor Rs, that is, when the current Is is zero.

Further, in order to suppress variation of Vid0 due to temperature characteristics of the base-emitter voltage Vbe1 of the NPN transistor Q1, the PWM signal generation circuit PM1 adjusts the duty of the PWM signal Vpwm according to ambient temperature of the NPN transistor Q1. For example, the duty of the PWM signal Vpwm is adjusted such that if the ambient temperature of the NPN transistor Q1 rises by 1° C., the smooth voltage Vsm falls by 2.6 mV.

Here, a description will be given of a derivation process of formula (1) described above.

Let Hight level of the PWM signal Vpwm be the power supply voltage Vcc, and let LOW level of the PWM signal Vpwm be the ground potential (0 V), then the smooth voltage Vsm can be represented by formula (1.1) below, where d represents the duty of the PWM signal Vpwm.

$$Vsm=Vcc{\cdot}d \qquad (1.1)$$

In the case where the NPN transistor Q1 has a sufficiently high hfe, formula (1.2) below holds.

$$Vsm=Vbe1+Vb+Vs \qquad (1.2)$$

In the case where the NPN transistor Q1 has a sufficiently high hfe, a current Ib flowing in the resistor Rb is represented by formula (1.3) below. And, a current Ia flowing in the resistor Ra has the same value as the current Ib flowing in the resistor Rb, a voltage drop Vain the resistor Ra is represented by formula (1.4) below.

$$Ib=Vb/b \qquad (1.3)$$

$$Va=a{\cdot}Ib=(a/b)(Vsm-Vbe1-Vs) \qquad (1.4)$$

From the power supply voltage Vcc and formula (1.4) above, the current detection signal Vid is represented by formula (1.5) below.

$$Vid = Vcc - Va \qquad (1.5)$$
$$= Vcc - (a/b)(Vsm - Vbe1 - Vs)$$
$$= Vcc - (a/b)(Vsm - Vbe1) - (a/b)Vs$$

From formulae (1.5) and (1.1) above, Vid0, which is Vid when Vs=0, is represented by formula (1.6) below.

$$Vid0 = Vcc - (a/b)(Vsm - Vbe1) \qquad (1.6)$$
$$= Vcc - (a/b)(Vcc{\cdot}d - Vbe1)$$

From formulae (1.5) and (1.6) above, formula (1) described farther above is obtained.

The PWM signal generation circuit PM1 can be whichever of a circuit that performs analog processing and a circuit that performs digital processing; however, a PWM signal generated by digital processing is more accurate than a PWM signal generated by analog processing and helps improve detection accuracy of the current detection 1, and thus it is desirable that the PWM signal generation circuit PM1 be a circuit that performs digital processing.

Figure 3:
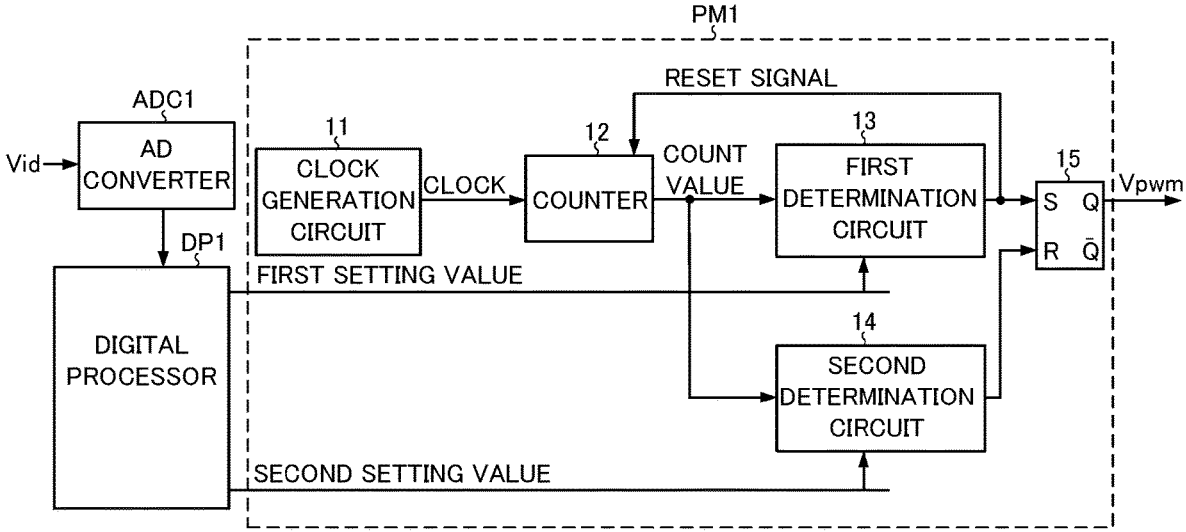
FIG. 3 is a diagram showing a configuration example of a PWM signal generation circuit that performs digital processing.

FIG. 3 is a diagram showing a configuration example of the PWM signal generation circuit PM1 that performs digital processing. In a case where the PWM signal generation circuit PM1 has the configuration shown in FIG. 3, the switching element control circuit CNT1 includes an AD converter ADC1 and a digital processor DP1.

The AD converter ADC1 supplies the digital processor DP1 with a digital signal obtained by AD-converting the current detection signal Vid.

The digital processor DP1 is configured to set a period and a pulse width of the PWM signal Vpwm based on the digital signal supplied from the AD converter ADC1, when no current is flowing in the current detection resistor Rs, that is, when the current Is is zero, and an output of a temperature sensor (not shown) that detects the ambient temperature of the NPN transistor Q1. As the digital processor DP1, there can be used, for example, a CPU (Central Processing Unit), a DSP (Digital Signal Processor), etc.

The PWM signal generation circuit PM1 having the configuration shown in FIG. 3 includes a clock generation circuit 11, a counter 12, a first determination circuit 13, a second determination circuit 14, and an output circuit 15.

The clock generation circuit 11 is configured to output a clock.

The counter 12 is configured to update a count value based on the clock generated by the clock generation circuit 11. Specifically, the count value is incremented by one for every period of the clock.

The first determination circuit 13 is configured to determine relationship between the count value of the counter 12 and a first setting value which is a value, supplied from the digital processor DP1, for setting the period of the PWM signal Vpwm. Specifically, the first determination circuit 13 determines whether or not the count value of the counter 12 has reached the first setting value. In a case where the count value of the counter 12 has reached the first setting value, the first determination circuit 13 outputs a HIGH-level signal. In a case where the count value of the counter 12 has not reached the first setting value, the first determination circuit 13 outputs a LOW-level signal.

The second determination circuit 14 is configured to determine relationship between the count value of the counter 12 and a second setting value which is a value, supplied from the digital processor DP1, for setting the pulse width of the PWM signal Vpwm. Specifically, the second determination circuit 14 determines whether or not the count value of the counter 12 has reached the second setting value. In a case where the count value of the counter 12 has reached the second setting value, the second determination circuit 14 outputs a HIGH-level signal. In a case where the count value of the counter 12 has not reached the second setting value, the second determination circuit 14 outputs a LOW-level signal.

The output circuit 15 is configured to generate the PWM signal Vpwm based on the output signal of the first determination circuit 13 indicating result of the determination by the first determination circuit 13 and the output signal of the second determination circuit 14 indicating result of the determination by the second determination circuit 14. In the configuration example shown in FIG. 3, as the output circuit 15, an RS flip-flop is used. To a set terminal (S terminal) of the RS flip-flop, the output signal of the first determination circuit 13 is supplied, and to a reset terminal (R terminal) of the RS flip-flop, the output signal of the second determination circuit 14 is supplied. Then, from an output terminal (Q terminal) of the RS flip-flop, the PWM signal Vpwm is output.

The output signal of the first determination circuit 13 is used also as a reset signal for resetting the counter 12. When the output signal of the first determination circuit 13 turns to HIGH level, the counter 12 resets the count value.

According to the configuration example shown in FIG. 3, it is possible, without providing a plurality of counters, to set the period and the pulse width of the PWM signal Vpwm each as desired. Without a plurality of counters, the PWM signal generation circuit PM1 can be made low-cost and compact.

Figure 4:
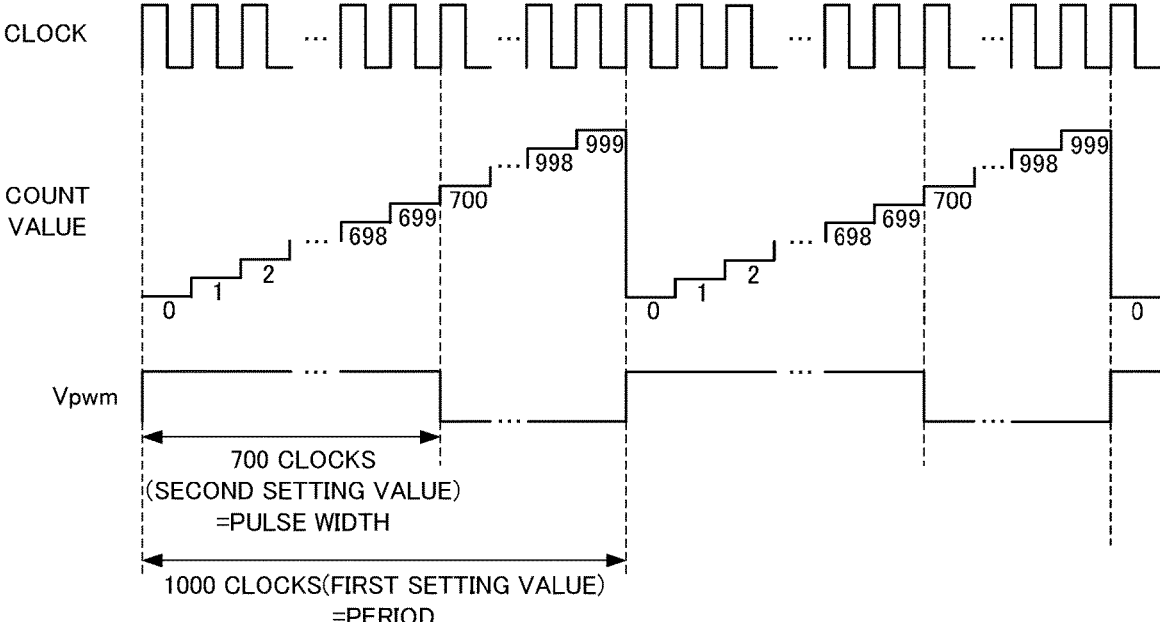
FIG. 4 is a diagram for illustrating operation of the PWM signal generation circuit shown in FIG. 3.

FIG. 4 is a diagram for illustrating operation of the PWM signal generation circuit PM1 shown in FIG. 3. In FIG. 4, the period of the PWM signal Vpwm is set to 1000 clocks, and the pulse width of the PWM signal Vpwm is set to 700 clocks. Consequently, in the example shown in FIG. 4, the duty of the PWM signal Vpwm becomes 0.7.

The switching element control circuit CNT1, after starting conditions for the switching power supply device 101 are satisfied, keeps the switching element TR1 off until the period and the pulse width of the PWM signal Vpwm are adjusted by the digital processor DP1 such that Vid0 becomes a predetermined value.

The digital processor DP1 fixes the first setting value, acquires a digital signal (a value of Vid0) from the AD converter ADC1, and continues adjusting the second setting value until the Vid0 becomes equal to the predetermined value by reducing the second setting value to reduce the duty of the PWM signal Vpwm if Vid0 is lower than a predetermined value and increasing the second setting value to increase the duty of the PWM signal Vpwm if Vid0 is higher than the predetermined value. The duty of the PWM signal Vpwm when Vid0 has become the predetermined value is regarded as the initial value of the duty of the PWM signal Vpwm. In this manner, it is possible to suppress the variation of Vid0 due to the individual difference of the base-emitter voltage Vbe1 of the NPN transistor Q1. After Vid0 becomes the predetermined value, the switching element control circuit CNT1 starts on/off control of the switching element TR1.

Further, in a case where, as compared to when the initial value of the duty of the PWM signal Vpwm is acquired, the ambient temperature of the NPN transistor Q1 has changed, the PWM signal generation circuit PM1 changes the duty of the PWM signal Vpwm from the initial value. Specifically, if the ambient temperature of the NPN transistor Q1 becomes high, the digital processor DP1 reduces the second setting value so as to reduce the duty of the PWM signal Vpwm, and if the ambient temperature of the NPN transistor Q1 becomes low, the digital processor DP1 increases the second setting value so as to increase the duty of the PWM signal Vpwm.

Second Embodiment

Figure 5:
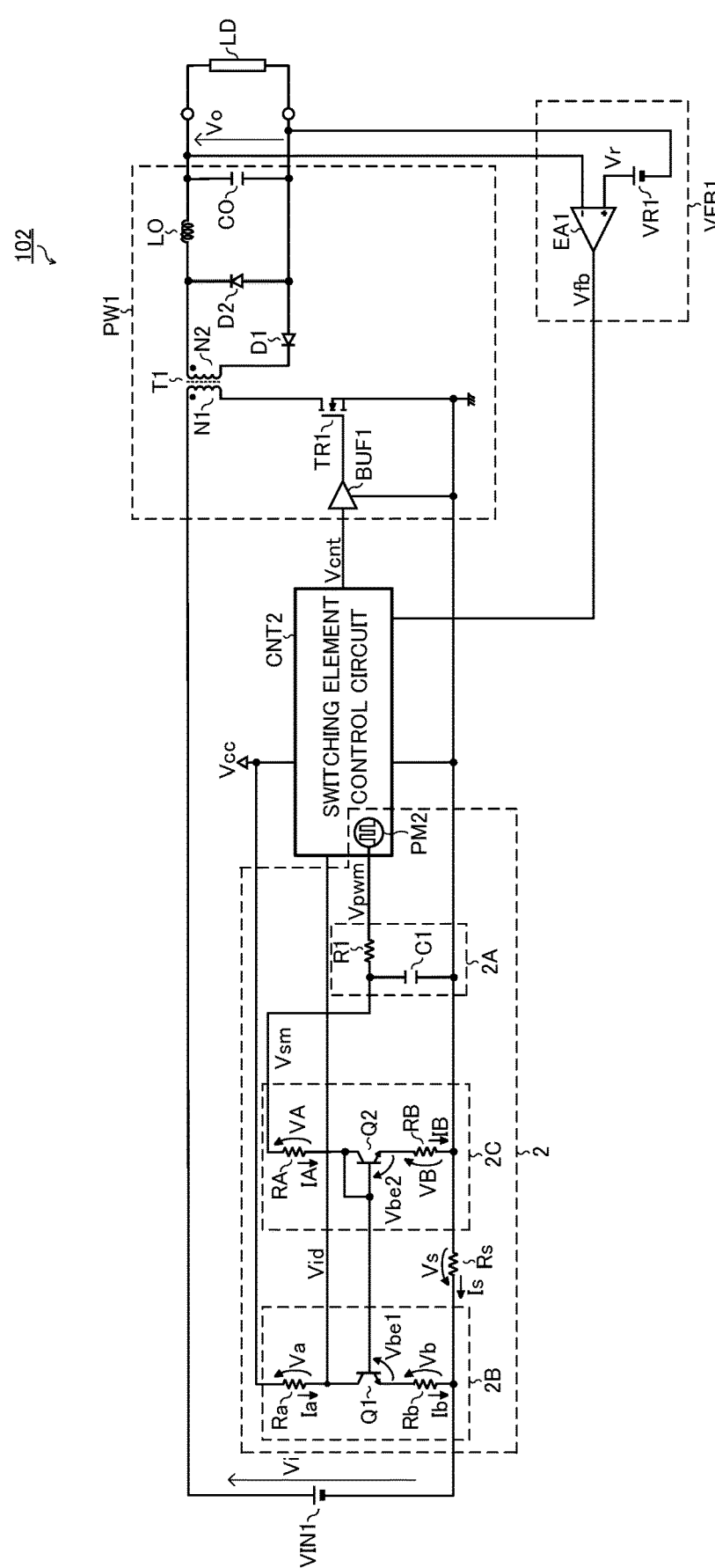
FIG. 5 is a diagram showing a schematic configuration of a switching power supply device according to a second embodiment.

FIG. 5 is a diagram showing a schematic configuration of a switching power supply device according to a second embodiment. A switching power supply device 102 according to the second embodiment (hereinafter referred to as "the switching power supply device 102") is a power supply device that converts the input voltage Vi generated by the input power supply VIN1 into the output voltage Vo and outputs the output voltage Vo. In FIG. 5, the same signs are given to the same components as those illustrated in FIG. 1, and detailed descriptions thereof will be omitted.

The switching power supply device 102 includes the power circuit PW1, the output voltage control signal generation circuit VFB1, a switching element control circuit CNT2, and a current detection circuit 2.

The switching element control circuit CNT2 is different from the switching element control circuit CNT1 of the first embodiment in that the switching element control circuit CNT2 includes a PWM signal generation circuit PM2 instead of the PWM signal generation circuit PM1 of the first embodiment, and is similar to the switching element control circuit CNT1 of the first embodiment in the other respects.

The PWM signal generation circuit PM2 is different from the PWM signal generation circuit PM1 of the first embodiment in that it does not perform the adjustment of the duty of the PWM signal Vpwm according to the ambient temperature of the NPN transistor Q1, and is similar to the PWM signal generation circuit PM1 of the first embodiment in the other respects.

The current detection circuit 2 includes the current detection resistor Rs, the PWM signal generation circuit PM2, a smoothing circuit 2A, an amplifier circuit 2B, and a temperature compensation circuit 2C. It should be noted that, although the PWM signal generation circuit PM2 is disposed inside the switching element control circuit CNT2 in the present embodiment, the PWM signal generation circuit PM2 may be disposed outside the switching element control circuit CNT2 instead.

The smoothing circuit 2A has a circuit configuration similar to that of the smoothing circuit 1A of the first embodiment. The amplifier circuit 2B has a circuit configuration similar to that of the amplifier circuit 1B of the first embodiment.

The temperature compensation circuit 2C is configured to suppress variation of the current detection signal Vid due to variation of the base-emitter voltage of the NPN transistor Q1 with temperature. The temperature compensation circuit 2C is disposed between the smoothing circuit 2A and the amplifier circuit 2B.

The temperature compensation circuit 2C includes a resistor RA, an NPN transistor Q2, and a resistor RB. To a first end of the resistor RA, the smooth voltage Vsm is supplied. A second end of the resistor RA is connected to a collector of the NPN transistor Q2, a base of the NPN transistor Q2, and a base of the NPN transistor Q1. An emitter of the NPN transistor Q2 is connected to a first end of the resistor RB. A second end of the resistor RB is connected to the ground potential.

In a case where the NPN transistor Q2 has a sufficiently high hfe, a current IA flowing in the resistor RA and a current IB flowing in the resistor RB have the same value, and thus formula (2.1) below holds, and a voltage drop VB in the resistor RB is represented by formula (2.2) below, where A represents a resistance value of the resistor RA, B represents a resistance value of the resistor RB, Vbe2 represents a base-emitter voltage of the NPN transistor Q2.

$$Vsm=VA+Vbe2+VB \tag{2.1}$$

$$VB=(Vsm-Vbe2)\cdot B/(A+B) \tag{2.2}$$

When no current is flowing in the current detection resistor Rs, that is, when the current Is is zero, the base of the NPN transistor Q1 and the base of the NPN transistor Q2 have the same potential, and thus formula (2.3) below holds, and a voltage drop Vb in the resistor Rb is represented by formula (2.4) below.

$$Vbe1+Vb=Vbe2+VB \tag{2.3}$$

$$Vb=Vbe2-Vbe1+VB \tag{2.4}$$

In a case where the NPN transistor Q1 has a sufficiently high hfe, the current Ia flowing in the resistor Ra and the current Ib flowing in the resistor Rb have the same value, and thus the voltage drop Va in the resistor Ra is represented by formula (2.5) below.

$$Va = Ib \cdot a \qquad (2.5)$$
$$= (Vbe2 - Vbe1 + VB) \cdot (a/b)$$
$$= (Vbe2 - Vbe1 + B \cdot (Vsm - Vbe2)/(A + B)) \cdot (a/b)$$

Further, when the current Is is zero, the current detection signal Vid0 can be obtained by subtracting the voltage drop Va in the resistor Ra from the power supply voltage Vcc, and thus is represented by formula (2.6) below.

$$Vid0 = Vcc - Va \qquad (2.6)$$
$$= Vcc - (\alpha + B \cdot \beta)(a/(b(A + B))$$
$$\alpha = Vbe2 - Vbe1, \beta = Vsm - Vbe2$$

The base-emitter voltage Vbe1 of the NPN transistor Q1 and a base-emitter voltage Vbe2 of the NPN transistor Q2 have the same temperature characteristics, and thus α indicated above does not vary with temperature. Further, if the NPN transistor Q1 and the NPN transistor Q2 are produced by the same production process, α indicated above becomes substantially zero. And, if the smooth voltage Vsm is sufficiently higher than the base-emitter voltage Vbe2 of the NPN transistor Q2, the smooth voltage Vsm can be approximated to β=Vsm, and thus β indicated above does not vary with temperature, either. That is, the temperature compensation circuit 2C can suppress variation of the current detection signal Vid0 with temperature when the current Is is zero.

Third Embodiment

Figure 6:
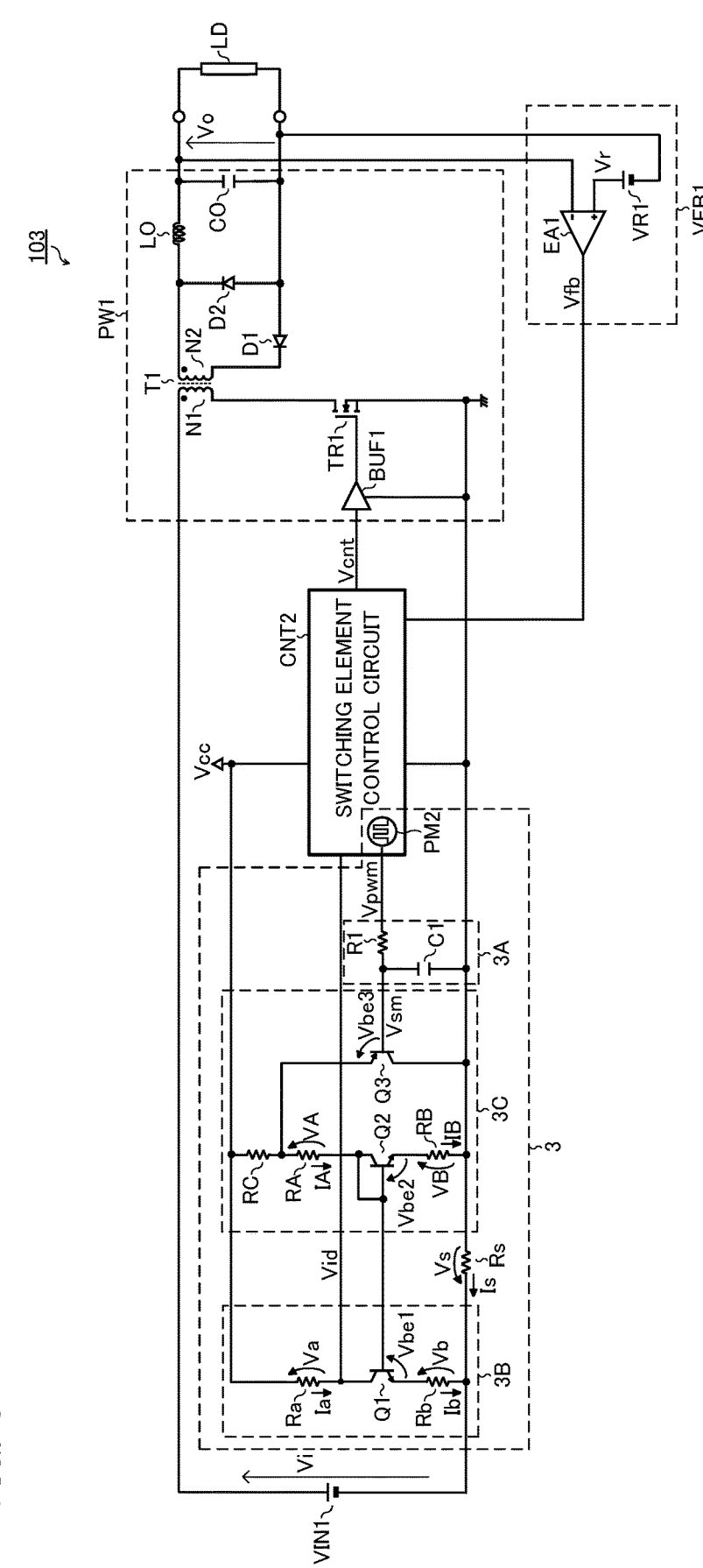
FIG. 6 is a diagram showing a schematic configuration of a switching power supply device according to a third embodiment.

FIG. 6 is a diagram showing a schematic configuration of a switching power supply device according to a third embodiment. A switching power supply device 103 according to the third embodiment (hereinafter referred to as "the switching power supply device 103") is a power supply device that converts the input voltage Vi generated by the input power supply VIN1 into the output voltage Vo and outputs the output voltage Vo. In FIG. 6, the same signs are given to the same components as those illustrated in FIG. 5, and detailed descriptions thereof will be omitted.

The switching power supply device 103 includes the power circuit PW1, the output voltage control signal generation circuit VFB1, the switching element control circuit CNT2, and a current detection circuit 3.

The current detection circuit 3 includes the current detection resistor Rs, the PWM signal generation circuit PM2, a smoothing circuit 3A, an amplifier circuit 3B, and a temperature compensation circuit 3C. It should be noted that, although the PWM signal generation circuit PM2 is disposed inside the switching element control circuit CNT2 in the present embodiment, the PWM signal generation circuit PM2 may be disposed outside the switching element control circuit CNT2 instead.

The smoothing circuit 3A has a circuit configuration similar to that of the smoothing circuit 2A of the second embodiment. The amplifier circuit 3B has a circuit configuration similar to that of the amplifier circuit 2B of the second embodiment.

The temperature compensation circuit 3C is configured to suppress variation of the current detection signal Vid due to variation of the base-emitter voltage of the NPN transistor Q1 with temperature. The temperature compensation circuit 3C is disposed between the smoothing circuit 3A and the amplifier circuit 3B.

The temperature compensation circuit 3C includes the resistor RA, the NPN transistor Q2, the resistor RB, a resistor RC, and a PNP transistor Q3. To a base of the PNP transistor Q3, the smooth voltage Vsm is supplied. To a first end of the resistor RC, the power supply voltage Vcc is supplied. A second end of the resistor RC and the first end of the resistor RA are connected to an emitter of the PNP transistor Q3. A collector of the PNP transistor Q3 is connected to the ground potential.

The second end of the resistor RA is connected to the collector of the NPN transistor Q2 and the base of the NPN transistor Q1. The emitter of the NPN transistor Q2 is connected to the first end of the resistor RB. The second end of the resistor RB is connected to the ground potential.

In a case where the NPN transistor Q2 and the PNP transistor Q3 each have a sufficiently high hfe, the current IA flowing in the resistor RA and the current IB flowing in the resistor RB have the same value, and thus formula (3.1) below holds, and the voltage drop VB in the resistor RB is represented by formula (3.2) below, where Vbe3 represents a base-emitter voltage of the PNP transistor Q3.

$$Vsm+Vbe3=VA+Vbe2+VB \qquad (3.1)$$

$$VB=(Vsm+Vbe3-Vbe2) \cdot B/(A+B) \qquad (3.2)$$

When no current is flowing in the current detection resistor Rs, that is, when the current Is is zero, the base of the NPN transistor Q1 and the base of the NPN transistor Q2 have the same potential, and thus formula (3.3) below holds, and the voltage drop Vb in the resistor Rb is represented by formula (3.4) below.

$$Vbe1+Vb=Vbe2+VB \qquad (3.3)$$

$$Vb=Vbe2-Vbe1+VB \qquad (3.4)$$

In a case where the NPN transistor Q1 has a sufficiently high hfe, the current Ia flowing in the resistor Ra and the current Ib flowing in the resistor Rb have the same value. Here, if the voltage drop VB in the resistor RB is represented by formula (3.2) above, the voltage drop Va in the resistor Ra is represented by formula (3.5) below.

$$Va=(Vbe2-Vbe1+B \cdot (Vsm+Vbe3-Vbe2)/(A+B)) \cdot (a/b) \qquad (3.5)$$

Further, the current detection signal Vid0 when the current Is is zero, which can be obtained by subtracting the voltage drop Va in the resistor Ra from the power supply voltage Vcc, is represented by formula (3.6) below.

$$Vid0 = Vcc - Va \qquad (3.6)$$
$$= Vcc - (\alpha + B \cdot \gamma)(a/(b(A + B))$$
$$\alpha = Vbe2 - Vbe1, \gamma = Vsm + Vbe3 - Vbe2$$

US 12,560,633 B2

11

The base-emitter voltage Vbe1 of the NPN transistor Q1, the base-emitter voltage Vbe2 of the NPN transistor Q2, and a base-emitter voltage Vbe3 of the PNP transistor Q3 have the same temperature characteristics, and thus α and γ indicated above do not vary with temperature. Further, if the NPN transistor Q1, the NPN transistor Q2, and the PNP transistor Q3 are produced by the same production process, α indicated above becomes substantially zero, and γ indicated above becomes substantially equal to the smooth voltage Vsm. That is, the temperature compensation circuit 3C can suppress variation of the current detection signal Vid0 with temperature when the current Is is zero. In the temperature compensation circuit 2C described previously, by making the power supply voltage Vcc sufficiently higher than the base-emitter voltage Vbe2 of the NPN transistor Q2 so as to be approximated to β=Vcc, variation of the base-emitter voltage Vbe2 of the NPN transistor Q2 with temperature is suppressed. In contrast, in the temperature compensation circuit 3C, γ=Vsm holds regardless of the value of the smooth voltage Vsm, and thus, even in a case where the smooth voltage Vsm is low, it is possible to suppress variation of the current detection signal Vid0 with temperature when the current Is is zero.

<Overcurrent Protection>

A description will be given of a case where the current detection signal Vid is used for overcurrent protection. In the case of using the current detection signal Vid for overcurrent protection, an overcurrent detection comparator is provided in the switching element control circuit CNT1 of the first embodiment, for example, and the overcurrent detection comparator compares the current detection signal Vid with a threshold value TH1; when the current detection signal Vid has become equal to or lower than the threshold value TH1, an overcurrent is detected, and when an overcurrent is detected, the switching element control circuit CNT1 stops on/off control of the switching element TR1 and keeps the switching element TR1 off.

There is a risk that, due to effects of parasitic capacitances of various units, a recovery current of the rectifier element, etc., a surge current may flow in the switching element TR1 immediately after the switching element TR1 is turned on, and the surge current may cause erroneous detection of an overcurrent. By providing a lowpass filter between a current detection resistor and an amplifier circuit, for example, erroneous detection of an overcurrent can be suppressed, but the lowpass filter may become a factor to cause response delay in overcurrent protection.

To prevent this, in the case of using the current detection signal Vid for overcurrent protection, it is desirable, for example, to set a time constant of the smoothing circuit 1A such that the smooth voltage Vsm becomes a triangular wave voltage, and for the PWM signal generation circuit PM1 having the configuration shown in FIG. 3 to synchronize the period of the PWM signal Vpwm with the switching period of the switching element TR1 such that when the switching element TR1 is turned on, that is, when a surge current flows in the switching element TR1, the PWM signal Vpwm is switched from LOW level to HIGH level. In this manner, when the switching element TR1 is turned on, the current detection signal Vid becomes high, and thus, even if no lowpass filter is provided or even if the amount of attenuation by the lowpass filter is reduced, it is possible to suppress erroneous detection of an overcurrent. Consequently, it is also possible to suppress response delay in the overcurrent protection.

Figure 7:
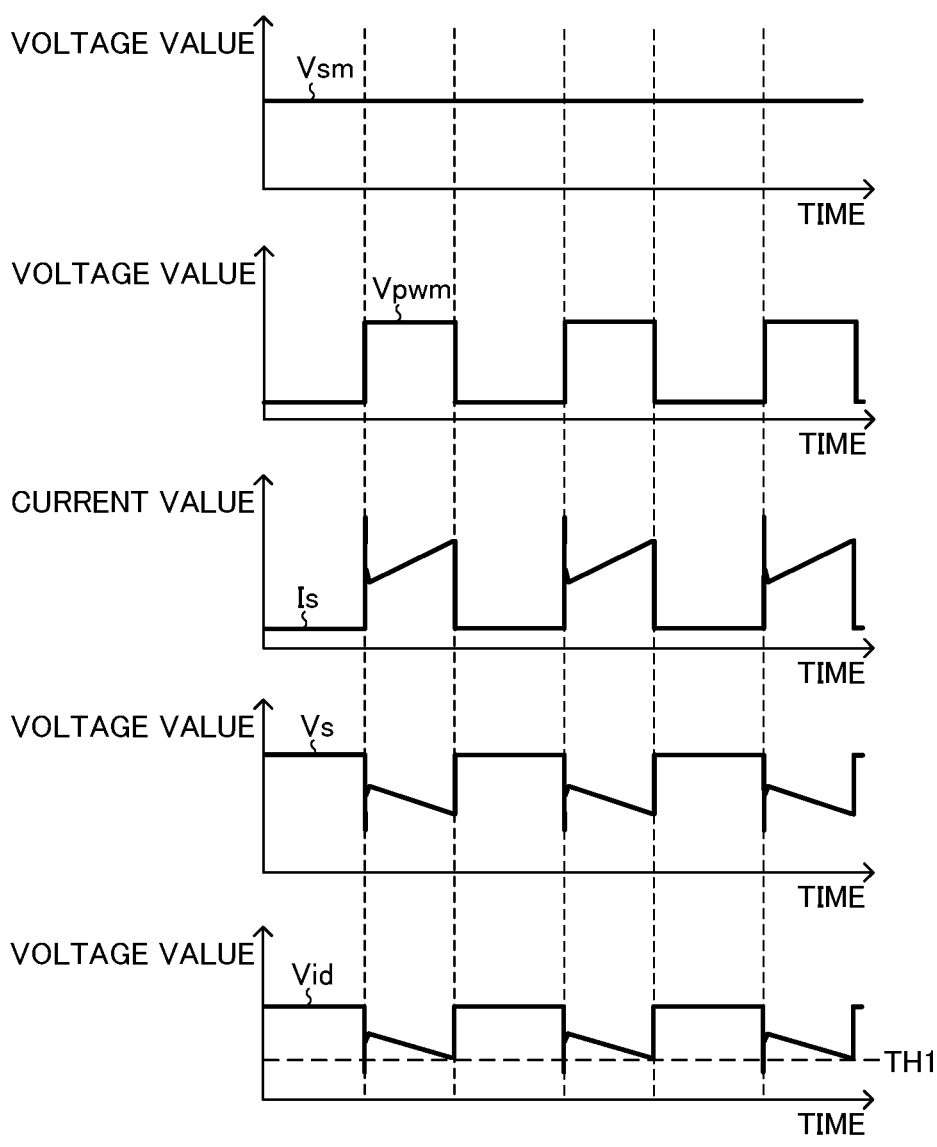
FIG. 7 is a diagram showing the waveforms of the voltages and the currents of various units in the switching power supply device shown in FIG. 1, with a time constant of a smoothing circuit set such that a smooth voltage becomes a substantially constant value.

FIG. 7 is a diagram showing the waveforms of the voltages and the currents of the various units in the switch-

Figure 8:
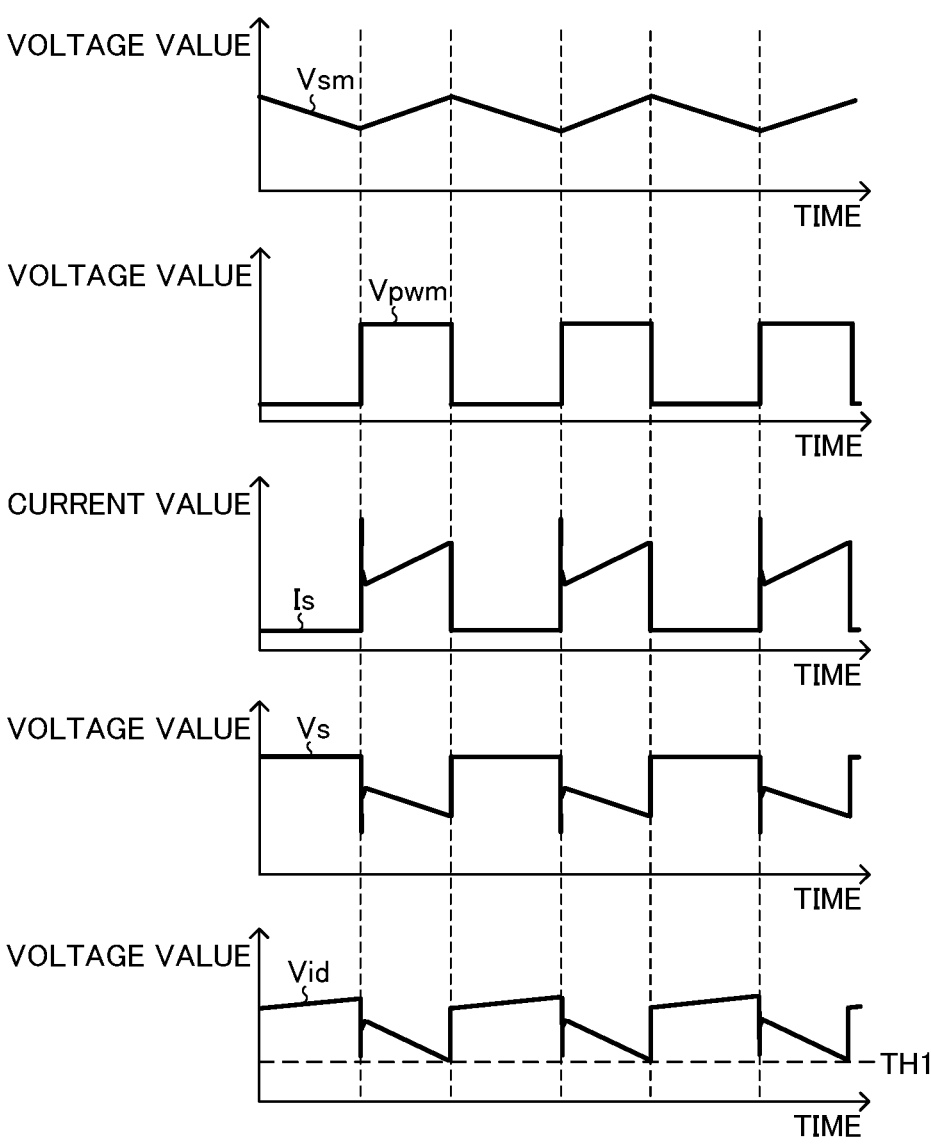
FIG. 8 is a diagram showing the waveforms of the voltages and the currents of various units in the switching power supply device shown in FIG. 1, with the time constant of the smoothing circuit set such that the smooth voltage becomes a triangular wave voltage.

12 ing power supply device 101 in a case where the time constant of the smoothing circuit 1A is set such that the smooth voltage Vsm has a substantially constant value. FIG. 8 is a diagram showing the waveforms of the voltages and the currents of the various units in the switching power supply device 101 in a case where the time constant of the smoothing circuit 1A is set such that the smooth voltage Vsm becomes a triangular wave voltage. From comparison between FIG. 7 and FIG. 8, it is clear that, by making the smooth voltage Vsm a triangular wave voltage, it is possible to cause the current detection signal Vid to rise while the switching element TR1 is off, to cause the current detection signal Vid become high when the switching element TR1 turns on, and thus to suppress erroneous detection of an overcurrent.

Here, in the case where the smooth voltage Vsm is a triangular wave voltage, in order for the digital processor DP1 shown in FIG. 3 to adjust the period and the pulse width of the PWM signal Vpwm such that Vid0 becomes the predetermined value, the AD converter ADC1 needs to be a fast-response AD converter with a high sampling rate, which results in high cost.

Thus, while the period and the pulse width of the PWM signal Vpwm are being adjusted by the digital processor DP1 such that Vid0 becomes the predetermined value when the current Is is not flowing in the current detection resistor Rs, the period of the PWM signal Vpwm is desirably reduced as compared to after the period and the pulse width of the PWM signal Vpwm have been adjusted by the digital processor DP1 such that Vid0 becomes the predetermined value when the current Is is not flowing in the current detection resistor Rs. The processing of reducing the period of the PWM signal Vpwm may start to be performed before the starting conditions for the switching power supply device are satisfied, or may be performed after the start conditions for the switching power supply device have been satisfied.

Note that while the period and the pulse width of the PWM signal Vpwm are being adjusted by the digital processor DP1 such that Vid0 becomes the predetermined value when the current Is is not flowing in the current detection resistor Rs, the period of the PWM signal Vpwm is desirably reduced to be equal to or shorter than one-fifth as compared to after the period and the pulse width of the PWM signal Vpwm have been adjusted by the digital processor DP1 such that Vid0 becomes the predetermined value when the current Is is not flowing in the current detection resistor Rs. In this manner, it is possible to set the smooth voltage Vsm to a substantially constant value while the period and the pulse width of the PWM signal Vpwm are being adjusted by the digital processor DP1 such that Vid0 becomes the predetermined value when the current Is is not flowing in the current detection resistor Rs.

While the period and the pulse width of the PWM signal Vpwm are being adjusted by the digital processor DP1 such that Vid0 has the predetermined value when the current Is is not flowing in the current detection resistor Rs, the period of the PWM signal Vpwm is more desirably reduced to be equal to or shorter than one-tenth, and still more desirably reduced to be equal to or shorter than one-twentieth, as compared to after the period and the pulse width of the PWM signal Vpwm have been adjusted by the digital processor DP1 such that Vid0 becomes the predetermined value when the current Is is not flowing in the current detection resistor Rs.

Figure 9:
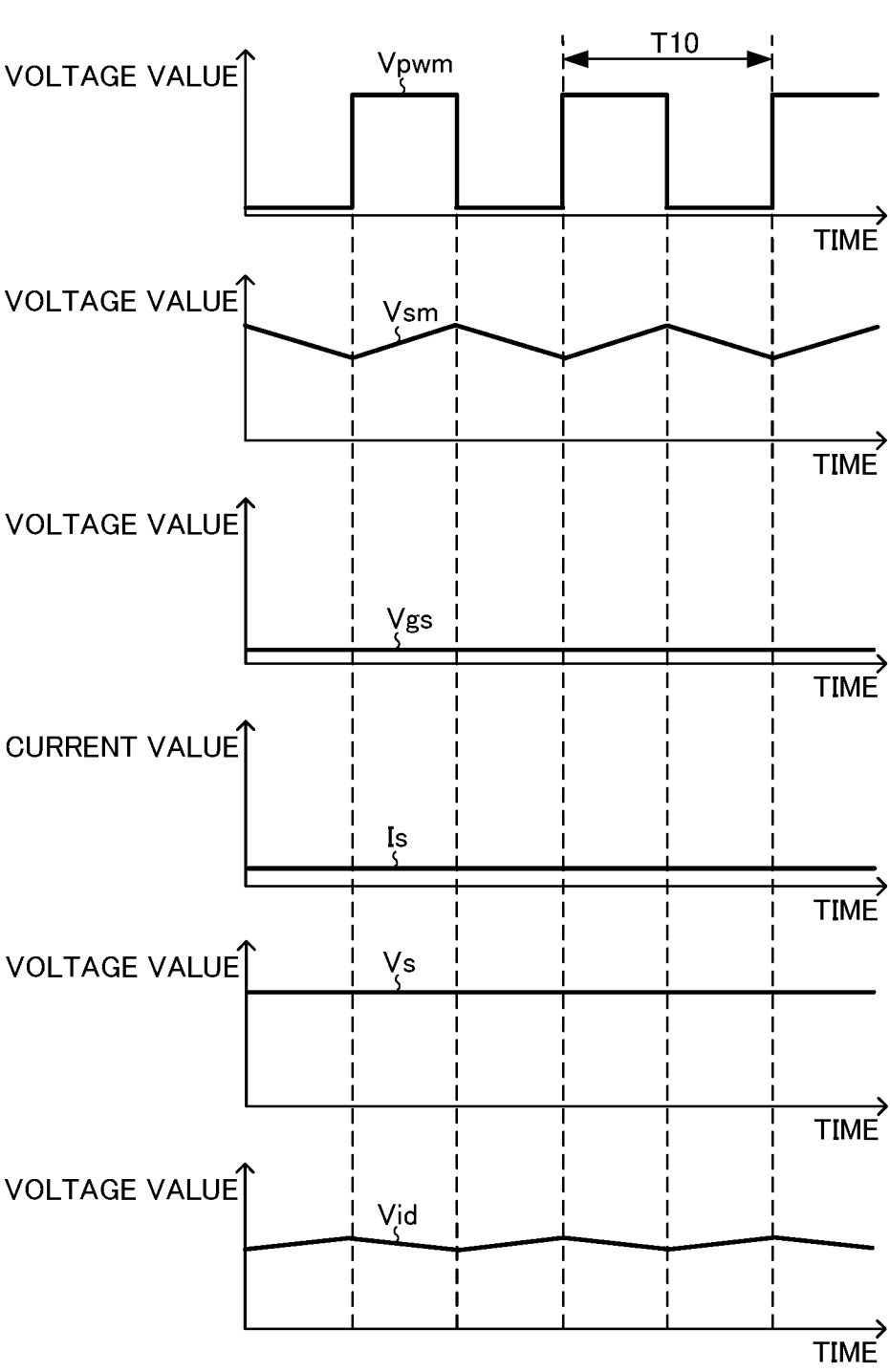
FIG. 9 is a diagram showing the waveforms of the voltages and the currents of various units in the switching power supply device shown in FIG. 1 when the period of a PWM signal is not made short.
Figure 10:
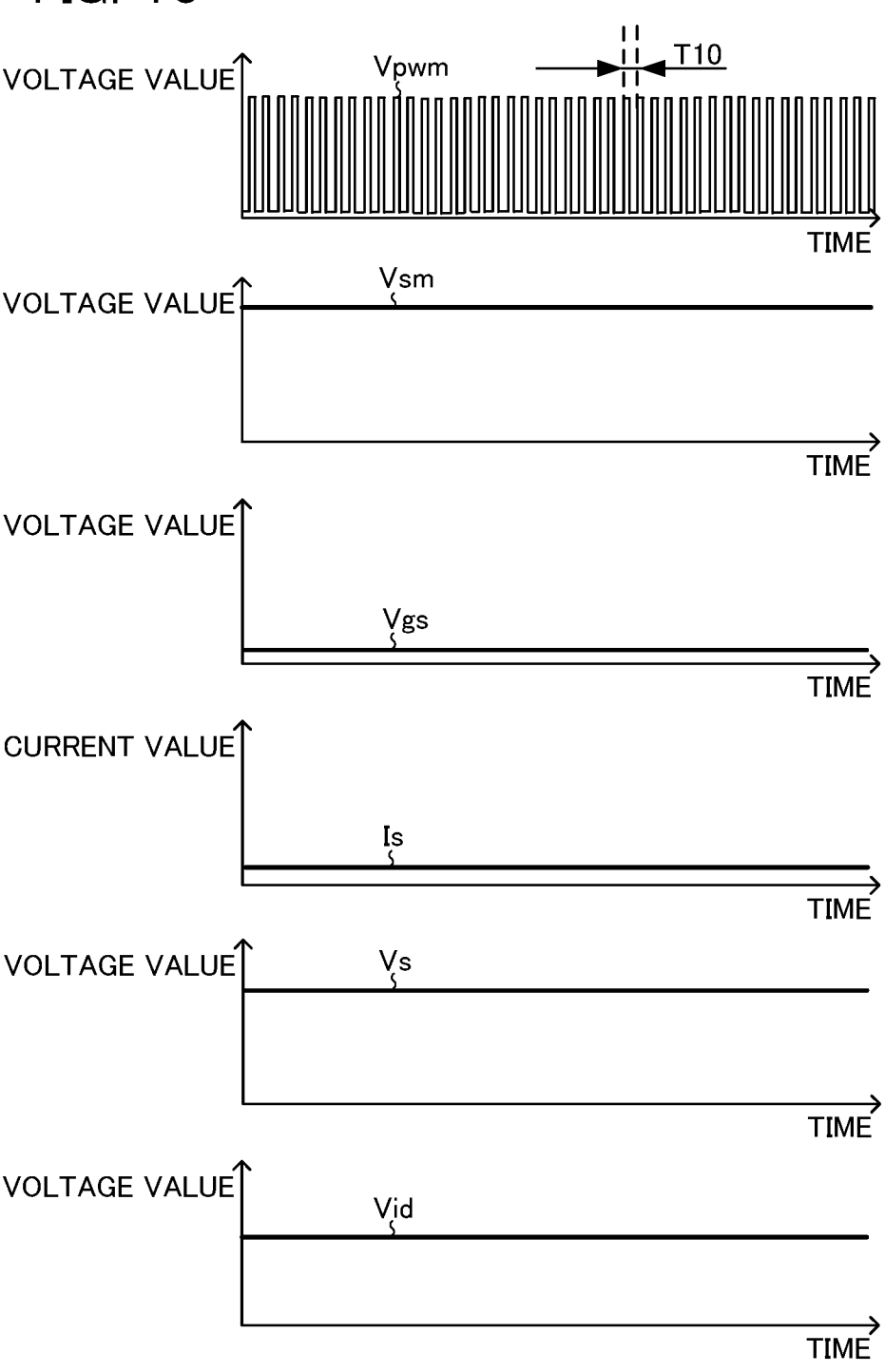
FIG. 10 is a diagram showing the waveforms of the voltages and the currents of various units in the switching power supply device shown in FIG. 1 when the period of a PWM signal is made short.

FIG. 9 is a diagram showing the waveforms of the voltages and the currents of various units in the switching power supply device 101 when a period T10 of the PWM signal Vpwm is not reduced. FIG. 10 is a diagram showing the waveforms of the voltages and the currents of various units in the switching power supply device 101 when the period T10 of the PWM signal Vpwm is reduced. From comparison between FIG. 9 and FIG. 10, it is clear that, by reducing the period of the PWM signal Vpwm, the substantially constant value can be achieved.

<Application Examples>

There is no limitation to devices or equipment in which to mount the above-described switching power supply device 1 or 2. That is, the above-described switching power supply device 1 or 2 may be mounted in industrial equipment, for example, or may be mounted in consumer equipment, for example.

Figure 11:
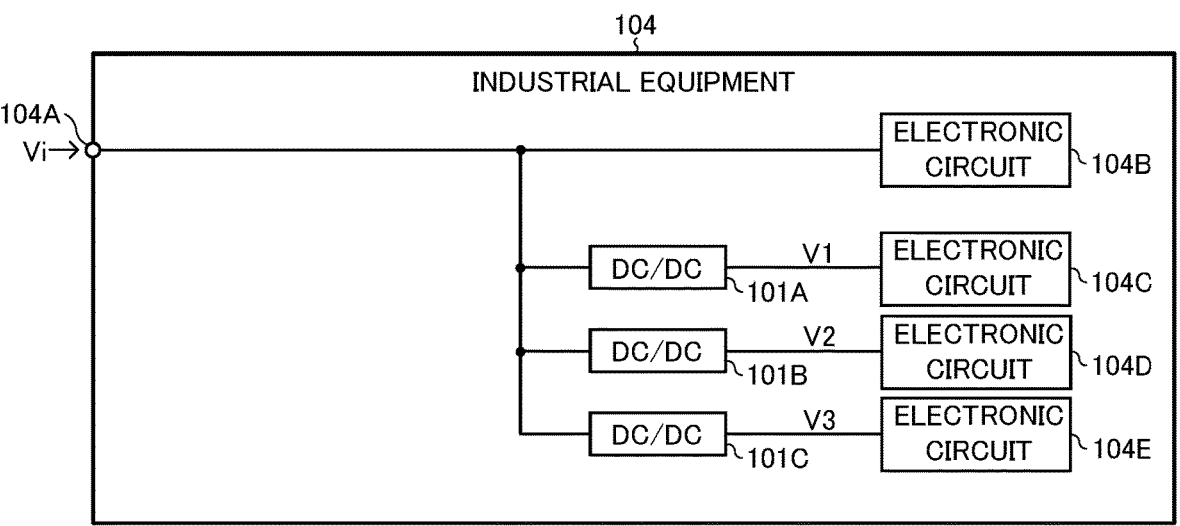
FIG. 11 is a diagram showing a schematic configuration of industrial equipment.

The switching power supply device 101 is mounted in industrial equipment 104 shown in FIG. 11, for example. That is, the industrial equipment 104 includes the switching power supply device 101. DC/DC converters 101A to 101C, which will be described later, are each the switching power supply device 101.

The number of electronic circuits and the number of DC/DC converters in the configuration shown in FIG. 11 are merely examples. For example, a configuration is possible where, unlike the configuration shown in FIG. 11, an electronic circuit 104B is removed such that electronic circuits and DC/DC converters are provided in equal numbers. The industrial equipment 104 shown in FIG. 11 includes an input terminal 104A, the DC/DC converters 101A to 101C, and electronic circuits 104B to 104E. To the input terminal 104A, the voltage Vi is supplied which is a direct current voltage. The input voltage Vi is supplied to the electronic circuit 104B and the DC/DC converters 101A to 101C. The electronic circuit 104B uses the input voltage Vi as a power supply voltage. The DC/DC converter 101A converts the input voltage Vi into a direct current voltage V1 different in value from the input voltage Vi, and supplies the direct current voltage V1 to the electronic circuit 104C. The electronic circuit 104C uses the direct current voltage V1 as a power supply voltage. The DC/DC converter 101B converts the input voltage Vi into a direct current voltage V2 different in value from the input voltage Vi, and supplies the direct current voltage V2 to the electronic circuit 104D. The electronic circuit 104D uses the direct current voltage V2 as a power supply voltage. The DC/DC converter 101C converts the input voltage Vi into a direct current voltage V3 different in value from the input voltage Vi, and supplies the direct current voltage V3 to the electronic circuit 104E. The electronic circuit 104E uses the direct current voltage V3 as a power supply voltage. The industrial equipment 104 shown in FIG. 11 is a radio base station in a mobile phone network, and, as the electronic circuits 104B to 104E, a circuit for antenna, a converter circuit that converts a high frequency signal into an intermediate frequency signal or a baseband signal, an FPGA (Field Programmable Gate Array), and the like are incorporated in the industrial equipment 104.

Besides a radio base station in a mobile phone network, examples of the industrial equipment include, for example, medical equipment, a robot provided in a production facility, etc.

Notes

In addition to the embodiments described above, the configuration of the present disclosure can be modified in many different forms without departing from the scope of the present disclosure. It should be understood that the foregoing embodiments are not limitative but illustrative in every respect. The technical scope of the present invention is not determined by the foregoing embodiments but by the claims, and should be construed to include all modifications equivalent in meaning and scope to the claims.

A current detection circuit (1, 2, 3) described above includes a current detection resistor (Rs) of which a first end is connected to a ground potential, a PWM signal generation circuit (PM1) configured to output a PWM signal, a smoothing circuit (1A, 2A, 3A) configured to generate a smooth voltage by smoothing the PWM signal, and an amplifier circuit (1B, 2B, 3B) configured to amplify a voltage generated at a second end of the current detection resistor; here, the amplifier circuit is a grounded-base circuit or a grounded-gate circuit, and a control terminal of a first transistor (Q1) included in the grounded-base circuit or the grounded-gate circuit is configured to receive a voltage that is based on the smooth voltage (a first configuration).

According to the current detection circuit having the above first configuration, it is possible, by adjusting the duty of the PWM signal, to suppress output variation of the amplifier circuit due to variation of the base-emitter voltage or the gate-source voltage of the first transistor, and thus to achieve a current detection circuit that is low-cost, high-speed, highly-accurate, and capable of detecting a negative voltage.

In the current detection circuit having the above first configuration, a period and a pulse width of the PWM signal is set such that an output of the amplifier circuit becomes a predetermined value when no current is flowing in the current detection resistor (a second configuration).

According to the current detection circuit having the above second configuration, the duty of the PWM signal can be adjusted with ease.

The current detection circuit having the above second configuration may further include a digital processor (DP1), and the digital processor may be configured to set the period and the pulse width of the PWM signal such that the output of the amplifier circuit becomes the predetermined value when no current is flowing in the current detection resistor (a third configuration).

According to the current detection circuit having the above third configuration, the PWM signal is generated by digital processing and the accuracy of the PWM is improved, as a result of which the detection accuracy of the current detection circuit can be improved.

In the current detection circuit having the above first or second configuration, the PWM signal generation circuit may include a clock generation circuit (11) configured to output a clock, a counter (12) configured to update a count value based on the clock, a first determination circuit (13) configured to determine a relationship between the count value and a first setting value for setting a period of the PWM signal, the first setting value being supplied from the digital processor, a second determination circuit (14) configured to determine a relationship between the count value and a second setting value for setting a pulse width of the PWM signal, the second setting value being supplied from the digital processor, and an output circuit (15) configured to generate the PWM signal based on a determination result of the first determination circuit and a determination result of the second determination circuit, and the counter may be configured to reset the count value based on the determination result of the first determination circuit (a fourth configuration).

According to the current detection circuit having the above fourth configuration, there is no need to provide a plurality of counters in the PWM signal generation circuit, and thus the PWM signal generation circuit can be made compact and low-cost.

In the current detection circuit having any one of the above first to fourth configurations, the current detection resistor may be configured to be connected in series to a switching element (TR1), the smooth voltage may be a triangular wave voltage, a period of the PWM signal may be synchronized with a switching period of the switching element, and the PWM signal may switch from LOW level to HIGH level when a surge current flows in the current detection resistor (a fifth configuration).

According to the current detection circuit having the above fifth configuration, it is possible to suppress erroneous detection of an overcurrent even if no lowpass filter is provided between the current detection resistor and the amplifier circuit or even if the amount of attenuation by the lowpass filter provided between the current detection resistor and the amplifier circuit is reduced. Thus, it is also possible to suppress response delay in the overcurrent protection.

In the current detection circuit having the above fifth configuration, while the period and a pulse width of the PWM signal are being adjusted such that an output of the amplifier circuit becomes a predetermined value when no current is flowing in the current detection resistor, the period of the PWM signal is reduced as compared to after the period and the pulse width of the PWM signal have been set such that the output of the amplifier circuit becomes the predetermined value when no current is flowing in the current detection resistor (a sixth configuration).

According to the current detection circuit having the above sixth configuration, it is possible, at low cost, to set the period and the pulse width of the PWM signal such that the output of the amplifier circuit becomes the predetermined value when no current is flowing in the current detection resistor.

The current detection circuit having the above sixth configuration may be configured such that, while the period and the pulse width of the PWM signal are being adjusted such that the output of the amplifier circuit becomes the predetermined value when no current is flowing in the current detection resistor, the period of the PWM signal is reduced to be equal to or shorter than one-fifth as compared to after the period and the pulse width of the PWM signal have been adjusted such that the output of the amplifier circuit becomes the predetermined value when no current is flowing in the current detection resistor (a seventh configuration).

According to the current detection circuit having the above seventh configuration, it is possible to set the smooth voltage to a substantially constant value while the period and the pulse width of the PWM signal are being adjusted by a digital processor such that the output of the amplifier becomes the predetermined value when no current is flowing in the current detection resistor.

The current detection circuit having any one of the above first to seventh configurations may further include a temperature compensation circuit (2C, 3C) configured to suppress variation of an output of the amplifier circuit due to variation of a base-emitter voltage or a gate-source voltage of the first transistor with temperature, and the temperature compensation circuit may be disposed between the smoothing circuit and the amplifier circuit (an eighth configuration).

According to the current detection circuit having the above eighth configuration, it is possible, without sensing ambient temperature of the first transistor, to suppress variation of the output of the amplifier circuit with temperature when a current flowing in the current detection resistor is zero.

In the current detection circuit having the above eighth configuration, the temperature compensation circuit (2C) may include a first resistor (RA), a second resistor (RB), and a second transistor (Q2), a first end of the first resistor may be connected to an output end of the smoothing circuit, a second end of the first resistor may be connected to a first end and a control end of the second transistor, and a second end of the second transistor may be connected via the second resistor to a first end of the current detection resistor (a ninth configuration).

According to the current detection circuit having the above ninth configuration, it is possible to minimize the number of transistors to be provided in the temperature compensation circuit.

In the current detection circuit having the above eighth configuration, the temperature compensation circuit (3C) may include a first resistor (RA), a second resistor (RB), a third resistor (RC), a second transistor (Q2), and a third transistor (Q3), a first end of the third resistor may be configured to have a power supply voltage applied thereto, a first end of the first resistor may be connected to a second end of the third resistor and a first end of the third transistor, a control end of the third transistor may be connected to an output end of the smoothing circuit, a second end of the third transistor may be connected to a first end of the current detection resistor, a second end of the first resistor may be connected to a first end and a control end of the second transistor, and a second end of the second transistor may be connected via the second resistor to a first end of the current detection resistor (a tenth configuration).

According to the current detection circuit having the above tenth configuration, it is possible, even when the smooth voltage Vsm is low, to suppress variation of the output of the amplifier circuit with temperature when the current flowing in the current detection resistor is zero.

A switching power supply device (101, 102, 103) described above includes the current detection circuit having any one of the above first to tenth configurations (an eleventh configuration).

According to the switching power supply device having the above eleventh configuration, it is possible to achieve a current detection circuit that is low-cost, fast-response, highly-accurate, and capable of detecting a negative voltage.

Industrial equipment (104) described above includes the current detection circuit having any one of the above first to tenth configurations, or the switching power supply device having the above eleventh configuration (a twelfth configuration).

According to the industrial equipment having the above twelfth configuration, it is possible to achieve a current detection circuit that is low-cost, fast-response, highly-accurate, and capable of detecting a negative voltage.

What is claimed is:
1. A current detection circuit, comprising:
a current detection resistor of which a first end is connected to a ground potential;
a PWM signal generation circuit configured to output a PWM signal;
a smoothing circuit configured to generate a smooth voltage by smoothing the PWM signal; and an amplifier circuit configured to amplify a voltage generated at a second end of the current detection resistor, wherein the amplifier circuit is a grounded-base circuit or a grounded-gate circuit, and a control terminal of a first transistor included in the grounded-base circuit or the grounded-gate circuit is configured to receive a voltage that is based on the smooth voltage.

2. The current detection circuit according to claim 1, wherein a period and a pulse width of the PWM signal is set such that an output of the amplifier circuit becomes a predetermined value when no current is flowing in the current detection resistor.

3. The current detection circuit according to claim 2, further comprising:

a digital processor, wherein the digital processor is configured to set the period and the pulse width of the PWM signal such that the output of the amplifier circuit becomes the predetermined value when no current is flowing in the current detection resistor.

4. The current detection circuit according to claim 1, wherein the PWM signal generation circuit includes a clock generation circuit configured to output a clock, a counter configured to update a count value based on the clock, a first determination circuit configured to determine a relationship between the count value and a first setting value for setting a period of the PWM signal, the first setting value being supplied from a digital processor, a second determination circuit configured to determine a relationship between the count value and a second setting value for setting a pulse width of the PWM signal, the second setting value being supplied from the digital processor, and an output circuit configured to generate the PWM signal based on a determination result of the first determination circuit and a determination result of the second determination circuit, and the counter is configured to reset the count value based on the determination result of the first determination circuit.

5. The current detection circuit according to claim 1, wherein the current detection resistor is configured to be connected in series to a switching element, the smooth voltage is a triangular wave voltage, a period of the PWM signal is synchronized with a switching period of the switching element, and the PWM signal switches from LOW level to HIGH level when a surge current flows in the current detection resistor.

6. The current detection circuit according to claim 5, wherein while the period and a pulse width of the PWM signal are being adjusted such that an output of the amplifier circuit becomes a predetermined value when no current is flowing in the current detection resistor, the period of the PWM signal is reduced as compared to after the period and the pulse width of the PWM signal have been set such that the output of the amplifier circuit becomes the predetermined value when no current is flowing in the current detection resistor.

7. The current detection circuit according to claim 6, wherein while the period and the pulse width of the PWM signal are being adjusted such that an output of the amplifier circuit becomes the predetermined value when no current is flowing in the current detection resistor, the period of the PWM signal is reduced to be equal to or shorter than one-fifth as compared to after the period and the pulse width of the PWM signal have been set such that the output of the amplifier circuit becomes the predetermined value when no current is flowing in the current detection resistor.

8. The current detection circuit according to claim 1, further comprising:

a temperature compensation circuit configured to suppress variation of an output of the amplifier circuit due to variation of a base-emitter voltage or a gate-source voltage of the first transistor with temperature, wherein the temperature compensation circuit is disposed between the smoothing circuit and the amplifier circuit.

9. The current detection circuit according to claim 8, wherein the temperature compensation circuit includes a first resistor, a second resistor, and a second transistor, a first end of the first resistor is connected to an output end of the smoothing circuit, a second end of the first transistor is connected to a first end and a control end of the second transistor, and a second end of the second transistor is connected via the second resistor to a first end of the current detection resistor.

10. The current detection circuit according to claim 8, wherein the temperature compensation circuit includes a first resistor, a second resistor, a third resistor, a second transistor, and a third transistor, a first end of the third resistor is configured to have a power supply voltage applied thereto, a first end of the first resistor is connected to a second end of the third resistor and a first end of the third transistor, a control end of the third transistor is connected to an output end of the smoothing circuit, a second end of the third transistor is connected to a first end of the current detection resistor, a second end of the first resistor is connected to a first end and a control end of the second transistor, and a second end of the second transistor is connected via the second resistor to a first end of the current detection resistor.

11. A switching power supply device comprising the current detection circuit according to claim 1.

12. Industrial equipment comprising the current detection circuit according to claim 1.

13. Industrial equipment comprising the switching power supply device according to claim 11.

* * * * *